US012770691B2

(12) United States Patent
Huang

(10) Patent No.: US 12,770,691 B2
(45) Date of Patent: Oct. 20, 2026

(54) METHOD OF ERASING MEMORY CELLS OF FLASH MEMORY DEVICE AND AN FLASH MEMORY DEVICE USING THE SAME

(71) Applicant: Winbond Electronics Corp., Taichung City (TW)

(72) Inventor: Koying Huang, San Jose, CA (US)

(73) Assignee: Winbond Electronics Corp., Taichung City (TW)

( * ) Notice: Subject to any disclaimer, the term of this patent is extended or adjusted under 35 U.S.C. 154(b) by 182 days.

(21) Appl. No.: 18/401,730

(22) Filed: Jan. 2, 2024

(65) Prior Publication Data

US 2025/0218517 A1 Jul. 3, 2025

(51) Int. Cl.

| | |
|---|---|
| ***G11C 16/16*** | (2006.01) |
| ***G11C 5/06*** | (2006.01) |
| ***G11C 11/56*** | (2006.01) |
| ***G11C 16/14*** | (2006.01) |
| ***G11C 16/34*** | (2006.01) |

(52) U.S. Cl.

CPC .............. *G11C 16/16* (2013.01); *G11C 5/063* (2013.01); *G11C 11/5635* (2013.01); *G11C 16/14* (2013.01); *G11C 16/34* (2013.01); *G11C 16/3445* (2013.01)

(58) Field of Classification Search

CPC ..... G11C 16/16; G11C 5/063; G11C 11/5635; G11C 16/3445

See application file for complete search history.

(56) References Cited

U.S. PATENT DOCUMENTS

| | | | | |
|---|---|---|---|---|
| 7,020,021 | B1 * | 3/2006 | Leung | G11C 11/5635 365/185.3 |
| 10,580,505 | B1 | 3/2020 | Chen | |
| 2002/0057599 | A1 | 5/2002 | Miyawaki et al. | |
| 2002/0060929 | A1 * | 5/2002 | Choi | G11C 16/3468 365/185.29 |
| 2004/0141378 | A1 * | 7/2004 | Tanzawa | G11C 16/3477 365/185.29 |

(Continued)

FOREIGN PATENT DOCUMENTS

| | | |
|---|---|---|
| CN | 102576568 | 2/2016 |
| TW | 1514393 | 12/2015 |

OTHER PUBLICATIONS

"Office Action of Taiwan Counterpart Application", issued on Jan. 15, 2025, p. 1-p. 7.

*Primary Examiner* — Donald HB Braswell
*Assistant Examiner* — Joseph Fidelis Stormes
(74) *Attorney, Agent, or Firm* — JCIPRNET

(57) ABSTRACT

The disclosure is directed to a method of erasing memory cells of a flash memory device including performing first erase operation to erase a block of memory cells of the flash memory device; increasing the erase bias voltage in a stepping manner until a lower edge of a distribution of threshold voltages of the block of memory cells is lower than an erase low side verify voltage; performing a first post program operation until the lower edge of the distribution of threshold voltages of the block of memory cells is higher than a post verify voltage; and performing a second erase operation to determine whether an upper edge of the distribution of threshold voltages of the block of memory cells is lower than an erase high side verify voltage.

20 Claims, 9 Drawing Sheets

(56) References Cited

U.S. PATENT DOCUMENTS

| | | | | |
|---|---|---|---|---|
| 2016/0111165 | A1* | 4/2016 | Shim | G11C 11/5635 365/185.11 |
| 2022/0101926 | A1 | 3/2022 | Oowada et al. | |
| 2022/0199163 | A1* | 6/2022 | Stoller | G11C 16/16 |

* cited by examiner

METHOD OF ERASING MEMORY CELLS OF FLASH MEMORY DEVICE AND AN FLASH MEMORY DEVICE USING THE SAME

TECHNICAL FIELD

The disclosure is directed to a method of erasing memory cells of a flash memory device and a flash memory device using the method.

BACKGROUND

A typical flash memory device must be erased before programmed. While a program operation may occur sequentially in a byte by byte manner, the erase operation must be performed over an entire block of memory cells. A flash memory device has two states, the two states are either 'programmed' or 'erased. To determine the state of a cell, a read operation must be performed on the cell. To perform a read operation, a reference voltage ($V_{TREF}$) is applied to the gate of a metal oxide field effect transistor (MOSFET) to determine whether the MOSFET conducts current or not. If the MOSFET conducts current, then the MOSFET has a logical state of '1'. If the MOSFET does not conduct current, then the MOSFET has a logical state of '0'. If the MOSFET stores a value of 1, the MOSFET is considered as being in an erased state. If the MOSFET stores a value of 0, the MOSFET is considered as being in a programmed state. For a MOSFET being in an erased state, the gate to source threshold voltage ($V_{GSTH}$) of the MOSFET is less than $V_{TREF}$. For a MOSFET being in a programmed state, the gate to source threshold voltage ($V_{GSTH}$) of the MOSFET is greater than $V_{TREF}$.

The program operation of a MOSFET is conducted by applying a high positive voltage (e.g. 9 volts) into the gate of the MOSFET and a lower positive voltage (e.g. 4 volts) into the drain of the MOSFET causing electrons to fill up the floating gate of the MOSFET device. The erase operation of a MOSFET is conducted by applying a high positive voltage (e.g. 8 volts) into the common p-well of the MOSFET and a strong negative voltage (e.g. −10 volts) is applied to the gate of the MOSFET causing electrons to be repelled from the floating gate of the MOSFET device.

After plotting the histogram plot of threshold voltages of all the cells of a memory block or page with the x axis being the threshold voltage and the y axis being the number of cells, it is well known that the cells in erased state is distributed in a Gaussian manner in the left side of the $V_{TREF}$ which is assumed to be in the middle of the plot, and the cells in the programmed state is distributed in a Gaussian manner in the right side of the $V_{TREF}$. However, when the gate to source threshold voltage of the cells in the left edge of the distribution is close to zero, leakage current may occur. These cells are typically called "over erased cells". Hence, a post program (i.e. soft program) operation is performed after the erase operation to recover the cells that are overly erased. Typically, while the erase operation is performed for an entire block or page of memory cells, the post program operation could be performed on a cell by cell basis.

The attempt to recover over erased cells could be problematic if the erase operation is suspended due to causes such as a power drop before the post program operation is finished. Under such circumstance, the over erased cells could not be recovered and can cause leakage current on the bit line at which the over erased cells are located. The leakage current can cause a cell storing the binary '0' to output a binary '1' reading as the result of the leakage current. The problem caused by a suspended erase operation is shown in FIG. 1.

As shown in FIG. 1, the distribution of all the memory cells of a memory block is typically divided into a distribution of programmed cells 101 holding a binary value of '0' and a distribution of erased cells 102 holding a binary value of '1'. After an erase operation is performed, a post program operation is assumed to be performed on the erased cells 102 to recover individual cells that are overly erased. After the post program operation, the distribution of erased cells 102 would ideally have threshold voltages less between an erased verify target 103 and a post program verify target 104. The distance between the erase verify target 103 and $V_{TREF}$ is typically known as an erase margin. The purpose of the post program verify target 104 is to serve as a target threshold voltage for recovering overly erased cells. In other words, the gate to source threshold voltage of an erased cell should be larger than the post program verify target 104 in order for the cell to avoid causing leakage current. However, in the example of FIG. 1, a power drop event is assumed to have occurred before the post program operation is finished. Consequently, a portion of the distribution of erased cells 102 as shown by the arrow may cause leakage current as the result of the power drop event. Therefore, a more robust method of erasing a flash memory device could be advantageous.

SUMMARY OF THE DISCLOSURE

The disclosure is directed to a method of erasing memory cells of a flash memory device and a flash memory device using the same method.

The disclosure is directed to a method of erasing memory cells of a flash memory device. The method includes: performing first erase operation to erase a block of memory cells of the flash memory device by applying an erase bias voltage on the block of memory cells; increasing the erase bias voltage in a stepping manner until a lower edge of a distribution of threshold voltages of the block of memory cells is lower than an erase low side verify voltage; performing a first post program operation for recovering overly erased memory cells of the block of memory cells until the lower edge of the distribution of threshold voltages of the block of memory cells is higher than a post verify voltage; performing a second erase operation to erase the block of memory cells to determine whether an upper edge of the distribution of threshold voltages of the block of memory cells is lower than an erase high side verify voltage; and having determined that the block of memory cells to have been completely erased after the distribution of threshold voltages of the block of memory cells is completely within the post verify voltage and the erase high side verify voltage.

The disclosure is directed to a flash memory device which includes: a block of memory cells, a memory controller electrically connected to the block of memory cells and configured to: perform first erase operation to erase a block of memory cells of the flash memory device by applying an erase bias voltage on the block of memory cells, increase the erase bias voltage in a stepping manner until a lower edge of a distribution of threshold voltages of the block of memory cells is lower than an erase low side verify voltage, perform a post program operation for recovering overly erased memory cells until the lower ledge of the distribution of threshold voltages of the block of memory cells is higher than a post verify voltage, perform a second erase operation to erase the block of memory cells until an upper edge of the distribution of threshold voltages of the block of memory cells is lower than an erase high side verify voltage, and determine that the block of memory cells to have been completely erased after the distribution of threshold voltages of the block of memory cells is completely within the post verify voltage and the erase high side verify voltage.

DETAILED DESCRIPTION OF DISCLOSED EMBODIMENTS

Figure 10:
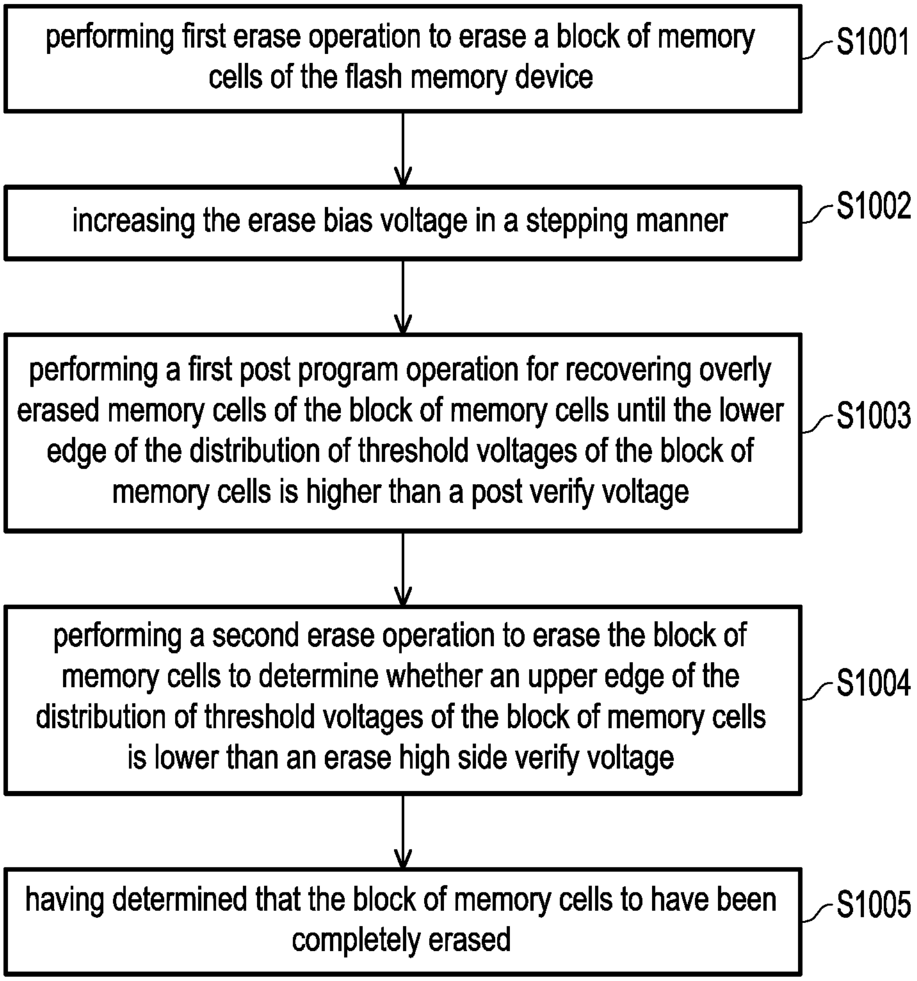
FIG. 10 is a flow chart which illustrates an overview of the method of erasing memory cells of a flash memory device according to an exemplary embodiment of the disclosure.

The disclosure provides a method of erasing memory cells of a flash memory device and a flash memory device using the method. An overview of the method is shown in FIG. 10. In step S1001 (i.e. S202), the flash memory device (e.g. 800) would perform a first erase operation to erase a block of memory cells (e.g. 803) of the flash memory device by applying an erase bias voltage on the block of memory cells. In step S1002, the flash memory device would increase the erase bias voltage in a stepping manner (to be shown in FIG. 3) until the threshold voltage of a lower edge 414 of a distribution of threshold voltages of the block of memory cells is lower than an erase low side verify voltage 412 (i.e. S203). In step S1003 (i.e. S204), the flash memory device would perform a first post program operation for recovering overly erased memory cells of the block of memory cells until the lower edge of the distribution of threshold voltages of the block of memory cells is higher than a post verify voltage 511. In step S1004, the flash memory device would perform a second erase operation (i.e. S206) to erase the block of memory cells to determine whether an upper edge of the distribution of threshold voltages of the block of memory cells is lower than an erase high side verify voltage 411 (i.e. S205). In step S1005, the flash memory device would perform would conclude that the block of memory cells to have been completely erased after the distribution of threshold voltages of the block of memory cells is completely within the post verify voltage 413 511 611 and the erase high side verify voltage 411. To further elucidate the above described concept, the disclosure provides several exemplary embodiments as follows.

Figure 1:
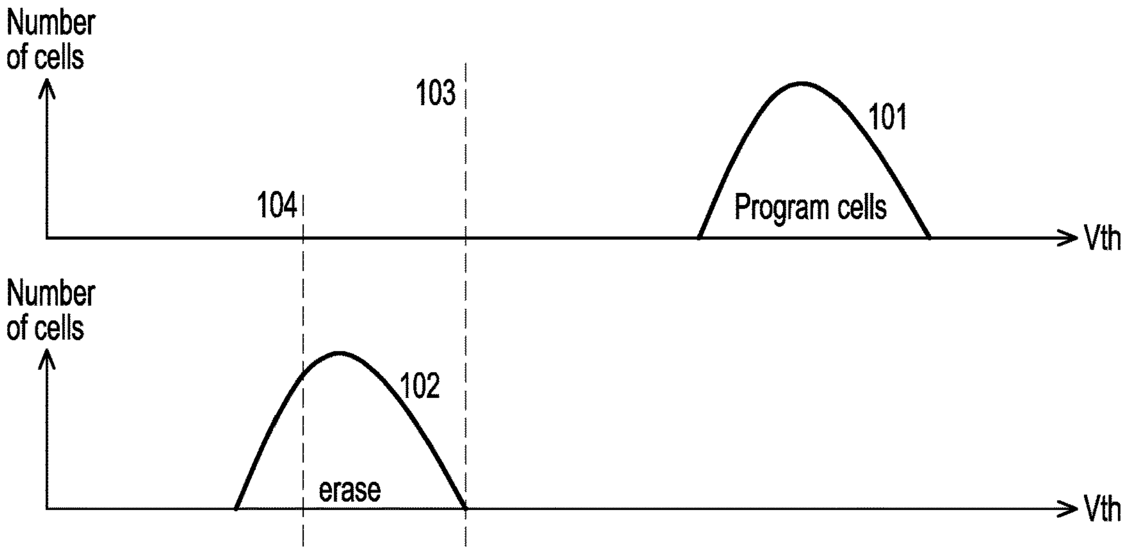
FIG. 1 illustrates a threshold voltage distribution of erased cells and programed cells of a memory block after a suspended erase operation.
Figure 2:
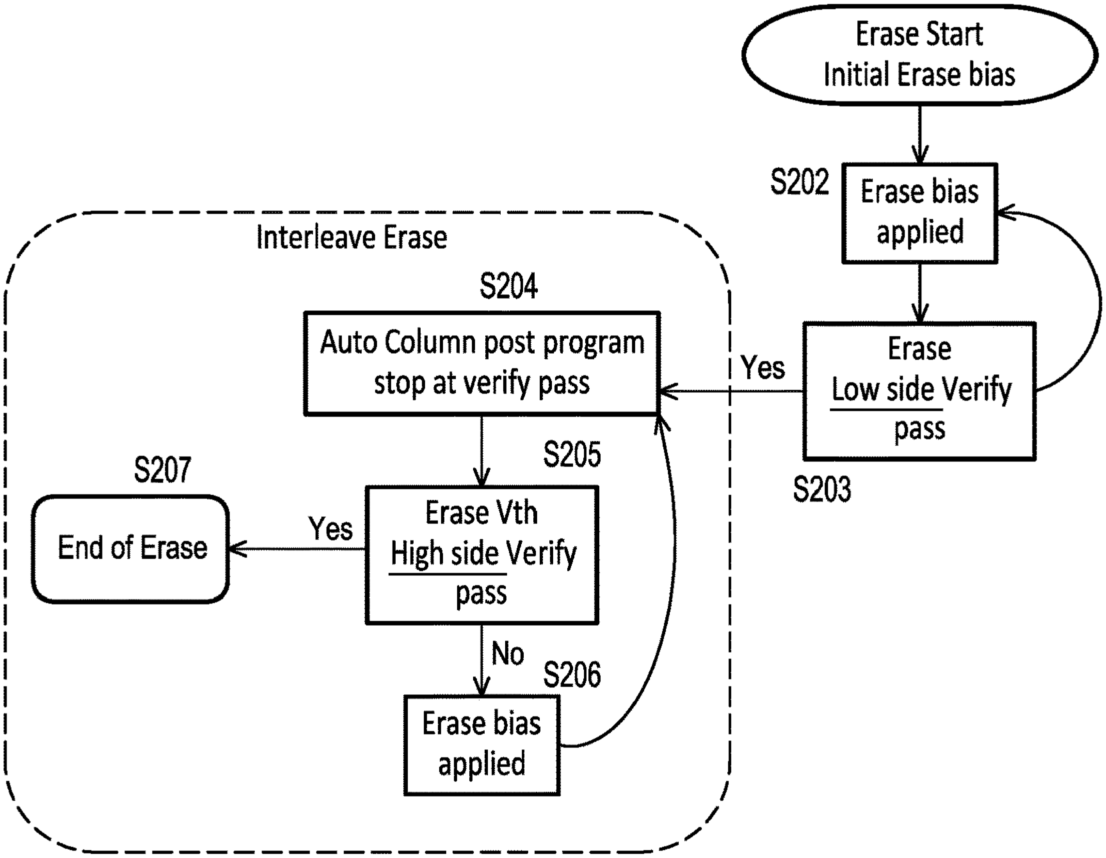
FIG. 2 is a flow chart which illustrates the method of erasing memory cells of a flash memory device according to an exemplary embodiment of the disclosure.

FIG. 2 shows the method of erasing memory cells of a flash memory device with further details. In step S201, the flash memory device is assumed to have received a command to erase a block of memory cells (e.g. 800). In step S202, a memory controller (e.g. 802, 905) may perform a first erase operation by applying an erase bias voltage to the block of memory cells. In step S203, the memory controller may derive the threshold voltages of the block of memory cells in order that the memory controller may determine whether the threshold voltage of a lower edge 414 of the distribution of the threshold voltages of the block of memory cells is lower than (or surpasses) the erase low side verify voltage 412 during the first erase operation. If no, then the method proceeds from step S202; if yes, the method proceeds from step S204.

In step S204, the memory controller may would start a post program operation to recover overly erased memory cells. The post program operation is performed automatically by the memory controller in a column by column manner (e.g. bit line by bit line). It is worth noting that while memory cells have to be erased as a block, the post program operation may recover overly erased memory cells in an individual cell basis, one bit line at a time. When the post program operation is complete, the threshold voltage of the lower edge 414 of the distribution of the threshold voltages of the block of memory cells should be higher than the post verify voltage 413 511 611. In step S205, the memory controller may determine whether the threshold voltage of an upper edge of the distribution of the threshold voltages of the block of memory cells is lower than the erase high side verify voltage 411. If no, then in step S206, the memory controller may perform a second erase operation on the block of memory cells and the process will proceed from step S204. Otherwise, the erase operation is considered as being complete. Under such condition, the threshold voltage of lower edge of the distribution of the threshold voltages of the block of memory cells should be higher than the post verify voltage, and the threshold voltage of the upper edge of the distribution of the threshold voltages of the block of memory cells should be lower than the erase high side verify voltage.

The erase low side verify voltage 412, the post verify voltage 413, and the erase high side verify voltage 411 are predetermined voltages. The purpose of the erase low side verify voltage 412 is to provide a target for the erase operation during steps S202 to reach before performing the post program operation in step S204. The purpose of the post verify voltage 413 is to provide a margin to avoid the memory cells having threshold voltages below the post verify voltage 413 possibly outputting leakage currents. The purpose of the high side verify voltage 411 is to provide an erase margin (i.e. a safe distance between $V_{Tref}$ and $V_{GSTH}$). The post verify voltage 413 is higher than the erase low side verify voltage 411.

Figure 3:
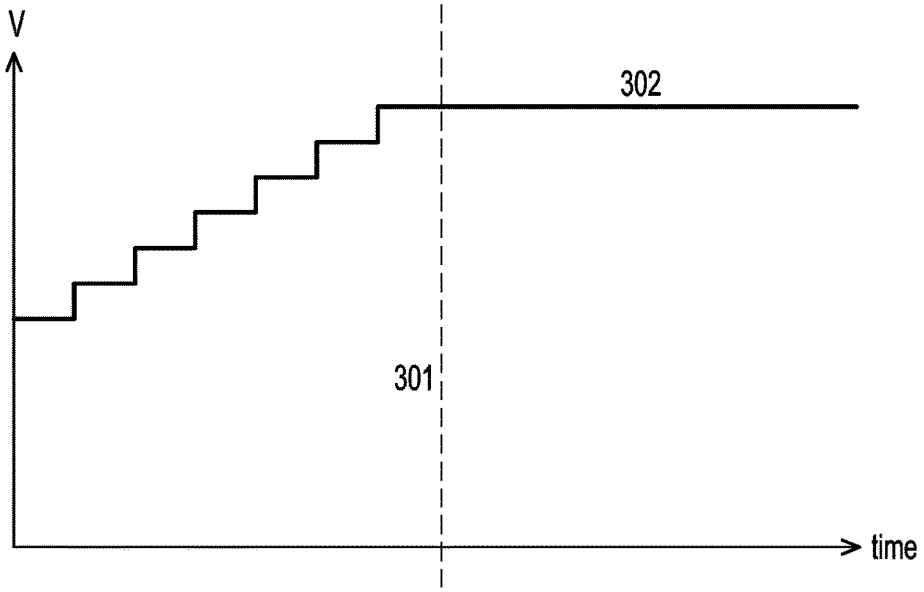
FIG. 3 illustrates increasing the erase bias voltage in a stepping manner according to an exemplary embodiment of the disclosure.

Step S202 and S203 may result in the erase operation being an iterative process, and each iteration of step S202 would result in the erase bias voltage being increased in a stepping manner. In other words, in step S203, if the threshold voltage of a lower edge 414 of the distribution of the threshold voltages of the block of memory cells is not lower than the erase low side verify voltage, then step S202 is repeated by increasing the erase bias in one step. The increase of the erase bias voltage in a stepping manner is shown in FIG. 3. If the threshold voltage of a lower edge 414 of the distribution of the threshold voltages of the block of memory cells is lower than the erase low side verify voltage 301, then the erase bias voltage is kept at a constant voltage 302. A voltage difference between the post verify voltage and the erase low side verify voltage could be less than a step increase of the erase bias voltage during increasing the erase bias voltage in the stepping manner.

Figure 4:
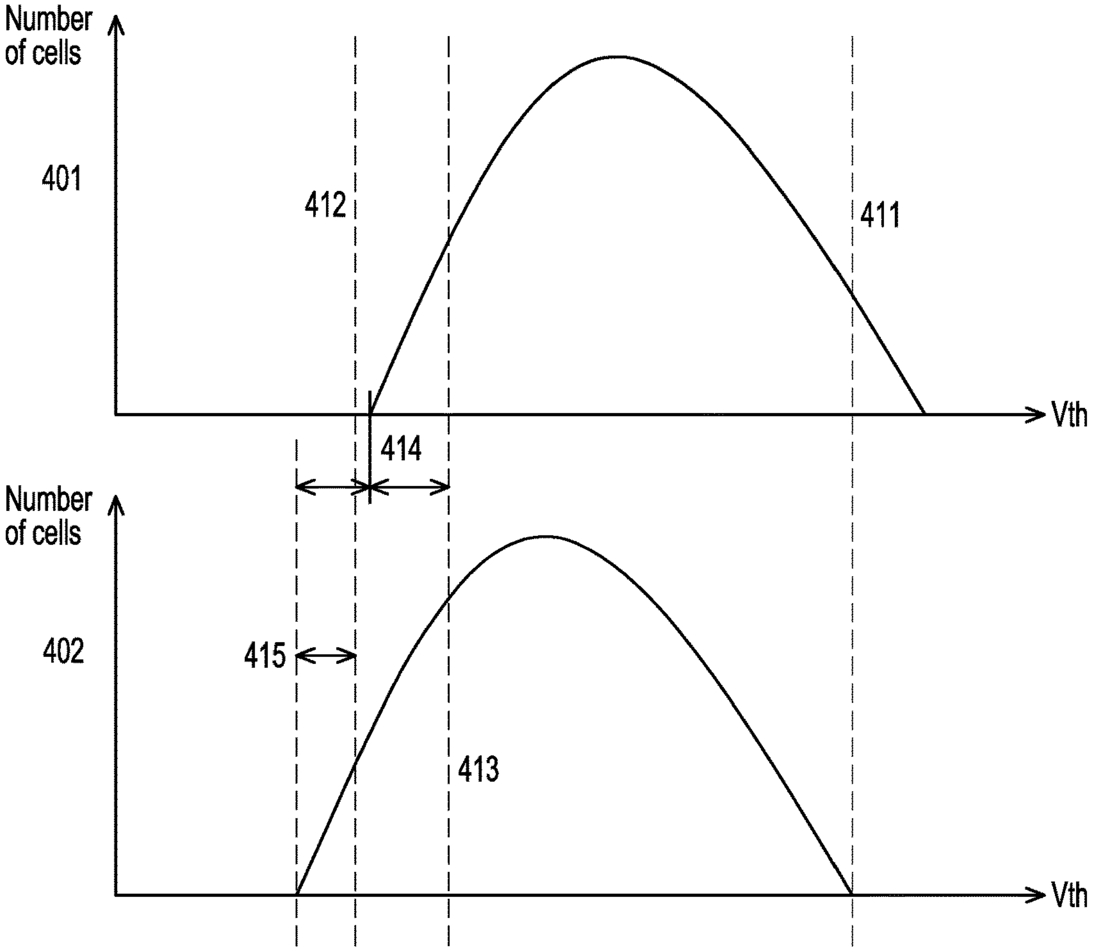
FIG. 4 illustrates performing an erase low side verify operation according to an exemplary embodiment of the disclosure.

The method of FIG. 2 is further described in FIG. 4 where the first graph 401 shows the result of an erase operation (e.g. S202) right before the threshold voltage of the lower edge 414 of the distribution of threshold voltages of the block of memory cells reaching the target of the erase low side verify voltage 412, and the second graph 402 shows the result of the next iteration of the erase operation (e.g. S202) after undergoing step S203. In the aftermath of the next iteration of the erase operation as shown in the second graph 402, the threshold voltage of the lower edge 415 of the distribution of threshold voltages of the block of memory cells being erased has surpassed the target of the erase low side verify voltage 412. Subsequently, the threshold voltage of the lower edge 415 of the distribution of threshold voltages of the block of memory cells has to be adjusted to be higher than the post verify voltage 413 in order to have a safe margin to avoid or minimize leaky currents.

Figure 5:
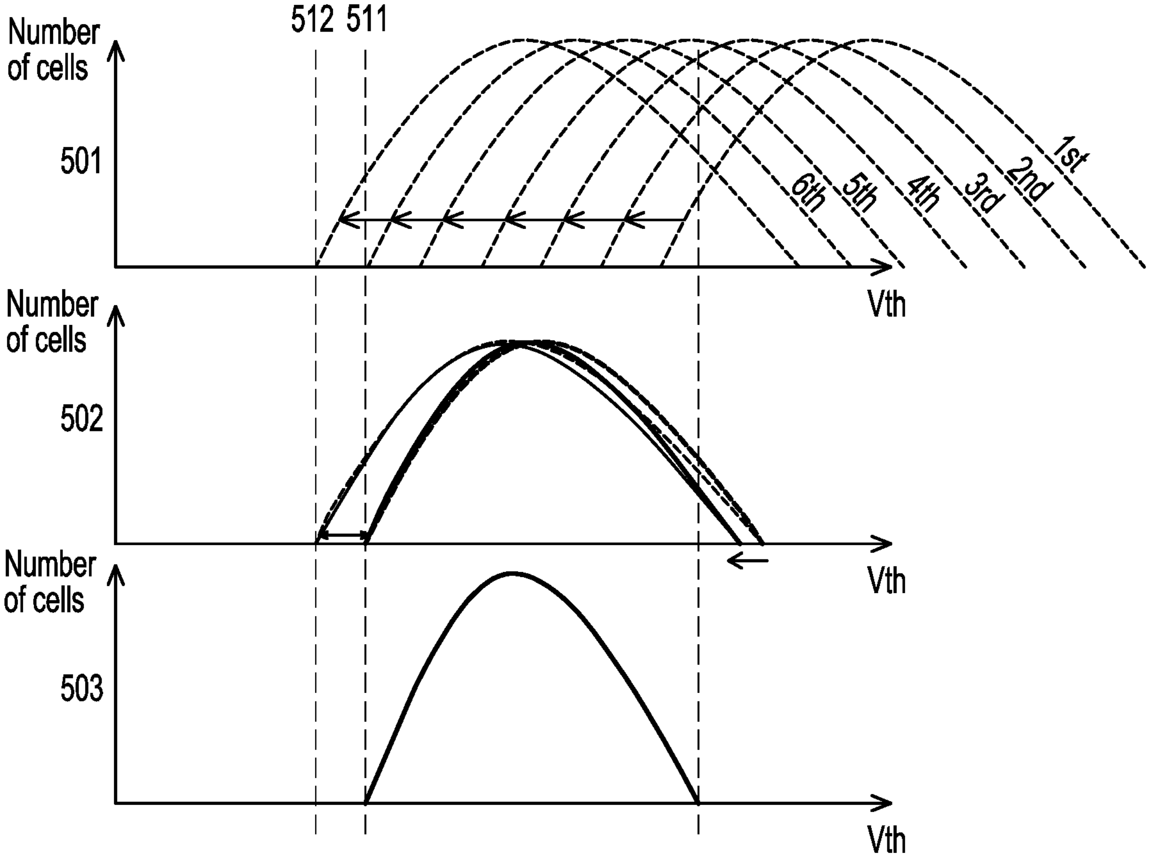
FIG. 5 illustrates an iterative erase operation according to an exemplary embodiment of the disclosure.

The method of FIG. 4 is shown with further details in FIG. 5. In the first graph 501 of FIG. 5, it shows 7 iterations of the erase operation of step S202. In the 6th iteration of the erase operation of step S202, the threshold voltage of the lower edge of the distribution of threshold voltages of the block of memory cells is close to the post verify voltage 511 but has not reached the erase low side verify voltage 512. In the last iteration of the erase operation of step S202, the erase low side verify voltage 512 has been reached. Under such circumstance, the threshold voltage of the lower edge of the distribution of threshold voltages of the block of memory cells is lower than the erase low side verify voltage 512. In the second graph 502 of FIG. 5, it shows an example of the post program operation of step S204 after which the lower edge of the distribution of threshold voltages of the block of memory cells is lower than the post verify voltage 511 but the threshold voltage of an upper edge of the distribution of threshold voltages of the block of memory cells is not lower than the erase high side verify voltage 513 which is a required condition for step S205 to progress to step S207. Consequently, another erase operation has to be performed in step S206 and the method will proceed from step S204. In the third graph 503 of FIG. 5, it shows the distribution of threshold voltages of the block of memory cells in step S207 when the distribution of threshold voltages is between the post verify voltage 511 and the erase high side verify voltage 513.

Figure 6:
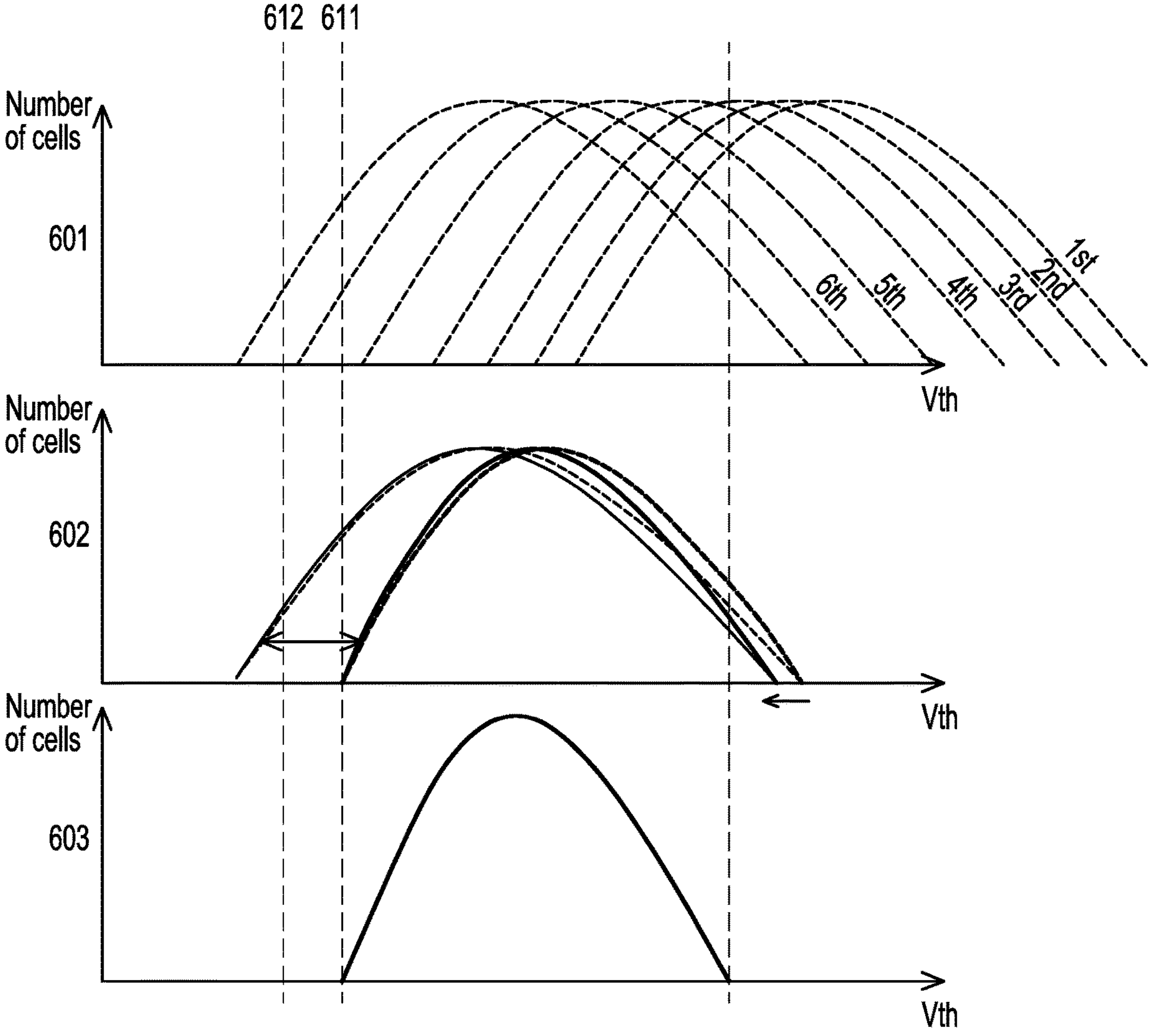
FIG. 6 illustrates an iterative erase operation according to another exemplary embodiment of the disclosure.

An example similar to FIG. 5 is shown in FIG. 6 where in the first graph 601 the last iteration of the erase operation has resulted in the threshold voltage of the lower edge of the distribution of threshold voltages of the block of memory cells having exceeded the erase low side verify voltage 612. Under such circumstance, in the second graph 602 the post program operation would bring the lower edge of the distribution of threshold voltages of the block of memory cells to be within the post verify voltage 611. Similar to FIG. 5, since the threshold voltage of an upper edge of the distribution of threshold voltages of the block of memory cells is not lower than the erase high side verify voltage 613, another iteration of steps S206, S204, and S205 has to be perform in order to arrive at the threshold voltage distribution of the third graph 603 of FIG. 6.

Figure 7:
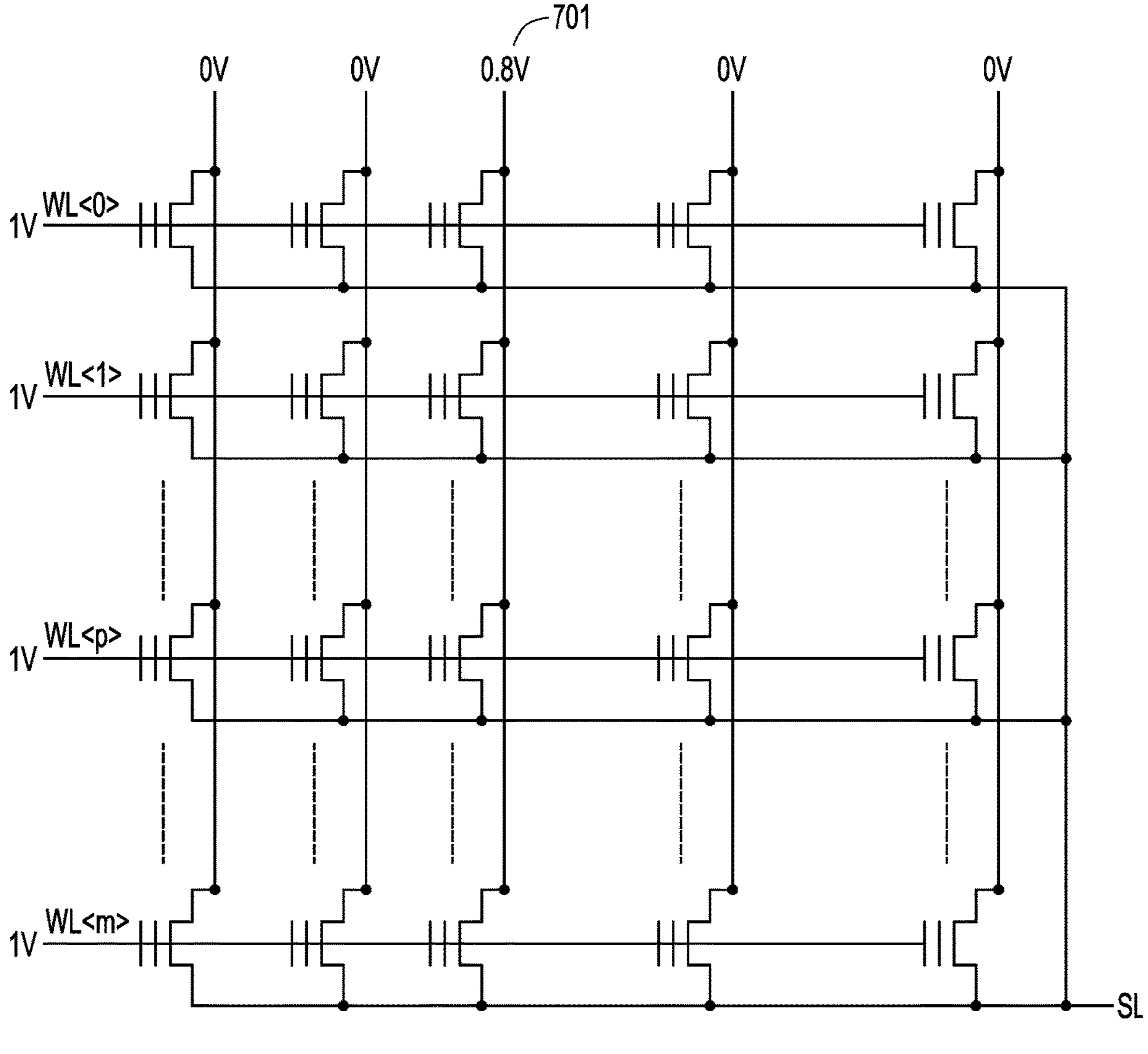
FIG. 7 illustrates hardware set up for performing a low side erase verify operation according to an exemplary embodiment of the disclosure.

In order to determine whether the threshold voltage of a lower edge of a distribution of threshold voltages of the block of memory cells is lower than an erase low side verify voltage in step S203, the hardware set up for performing step S203 could be as shown in FIG. 7. In the hardware setup of FIG. 7, the word lines are fed with a first voltage which could be, for example, 1 volt. The bit lines are turned on one by one, and the bit line that is turned on could be applied with a second voltage which could be, for example, 0.8 volt. The second voltage could be the erase low side verify voltage or close to the erase low side verify voltage. For the bit line 701 that is turned on, the bit line is set with the second voltage to determine whether the bit line conducts current or not. If the bit line 701 conducts current when the bias voltage is at 0.8 volt, then the threshold voltage of a lower edge of a distribution of threshold voltages of the block of memory cells has reached the erase low side verify voltage. If the bit line 701 does not conduct current, then the bias voltage of the bit line could be set to be lower.

Figure 8:
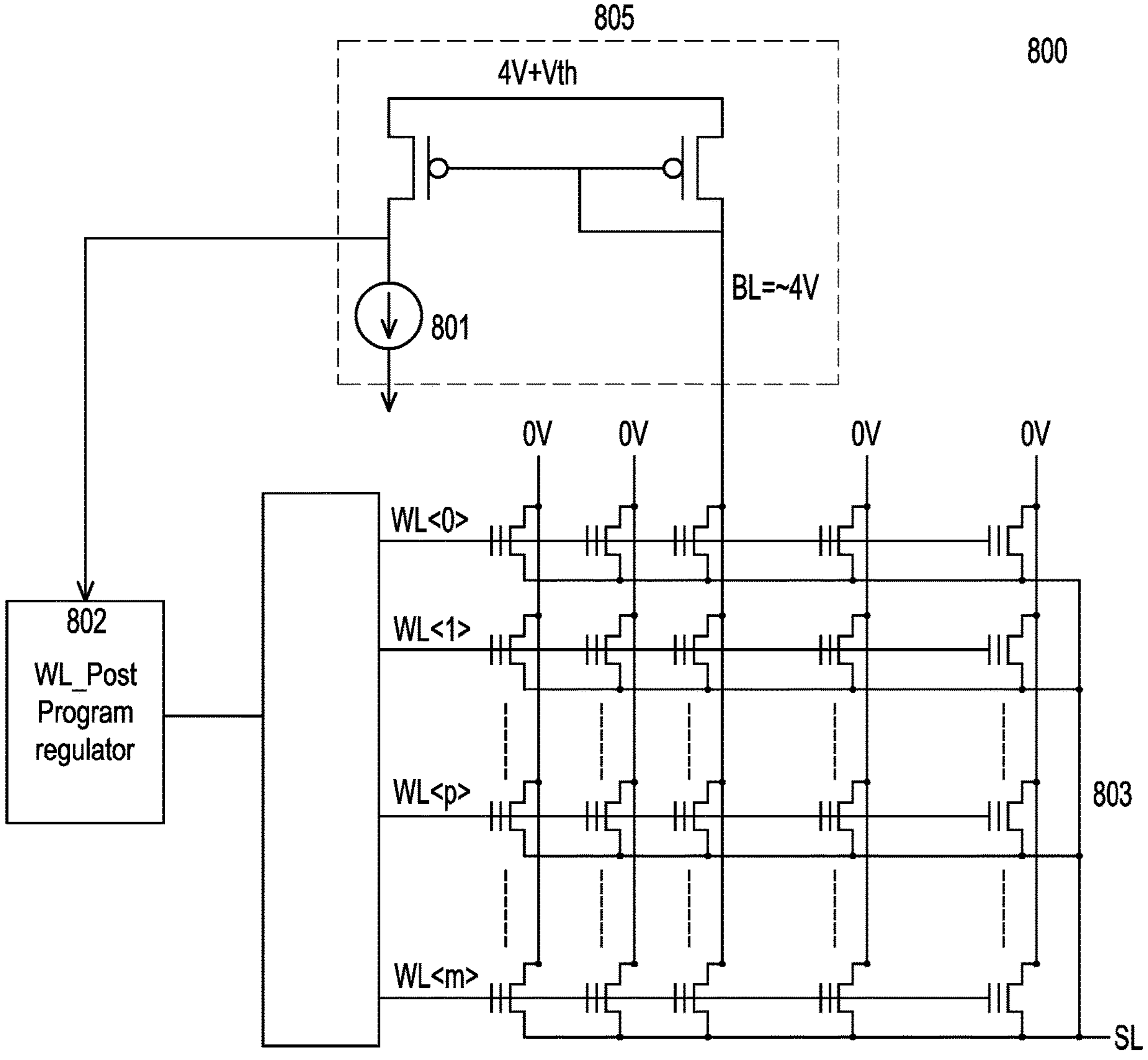
FIG. 8 illustrates a hardware set up for performing a post program operation according to an exemplary embodiment of the disclosure.

The hardware circuit 800 for performing the method of FIG. 2 is shown in FIG. 8 where the memory cells 803 are assumed to be the block of memory cells to be erased. In this exemplary embodiment, the erase operation is conducted by a word line post program regulator 802 which is a part of a memory controller 802 which is typically disposed within a flash memory device. When performing a post program operation of step S204, the overly erased memory cells are recovered one bit line at a time. In the bit line (e.g. 804) for which the post program operation is conducted, a constant bias voltage is applied on the bit line 804. The constant bias voltage could be, for example, 4 volts. At the same time, a word line voltage is increasingly applied on the word lines while the leakage current on the bit line 804 is monitored by a bit line current detector 805 in which the current detector 801 detects the current mirrored from the bit line 804.

Figure 9:
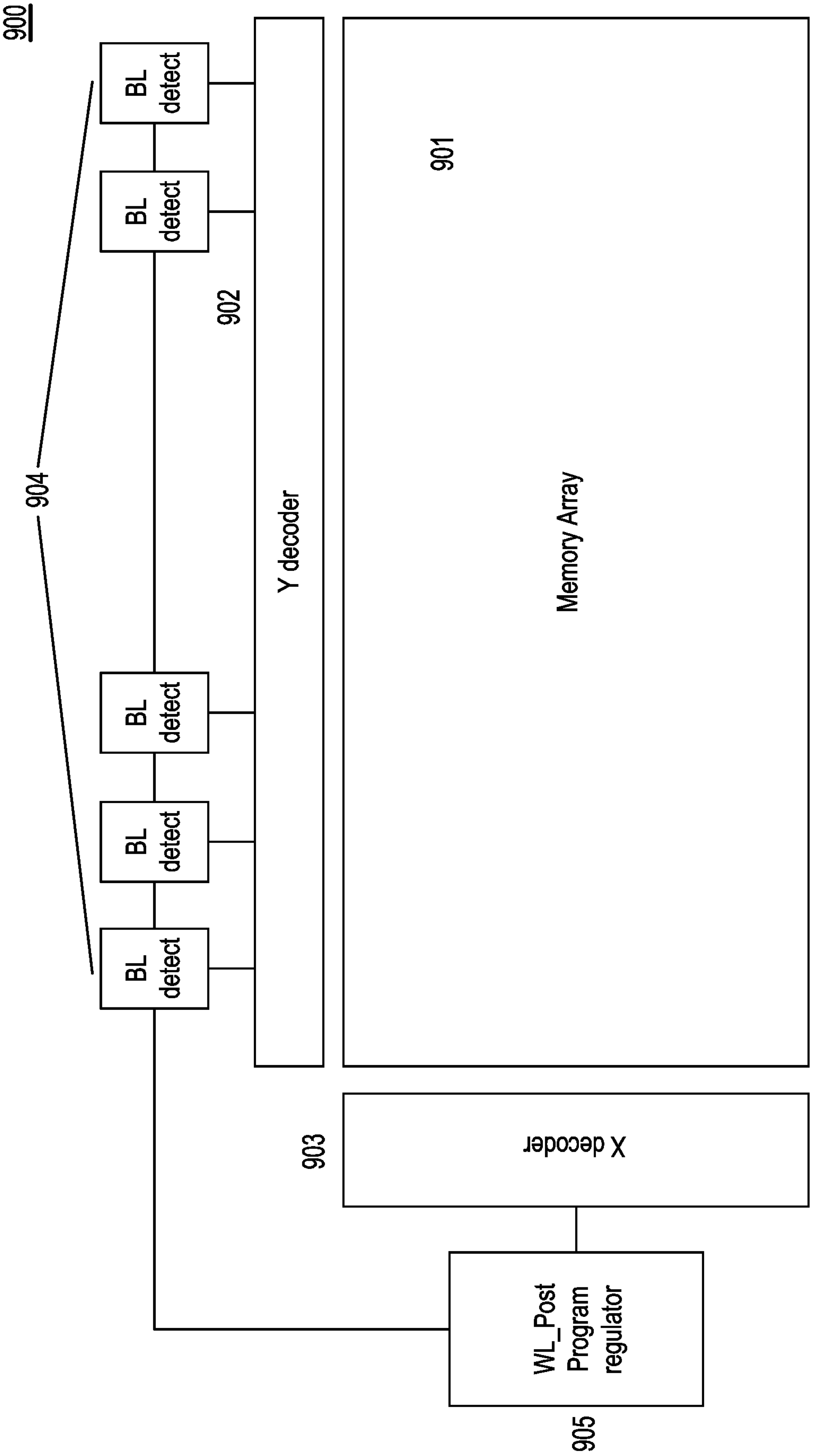
FIG. 9 illustrates a hardware block diagram for performing a post program operation according to an exemplary embodiment of the disclosure.

FIG. 9 shows hardware circuit 800 of FIG. 8 with further details. Comparing the FIG. 8, the hardware circuit 900 of FIG. 9 further includes a X decoder 900 for controlling each individual word lines and a Y decoder 900 for controlling each individual bit line while the memory array 901 is the same as the block of memory cells 803. Each of the bit lines could be connected to an individual bit line current detector 904 (e.g. 805). The selection of the word lines and the bit lines as well as the related operations of FIG. 2 could be performed by the memory controller 905.

Figure 11:
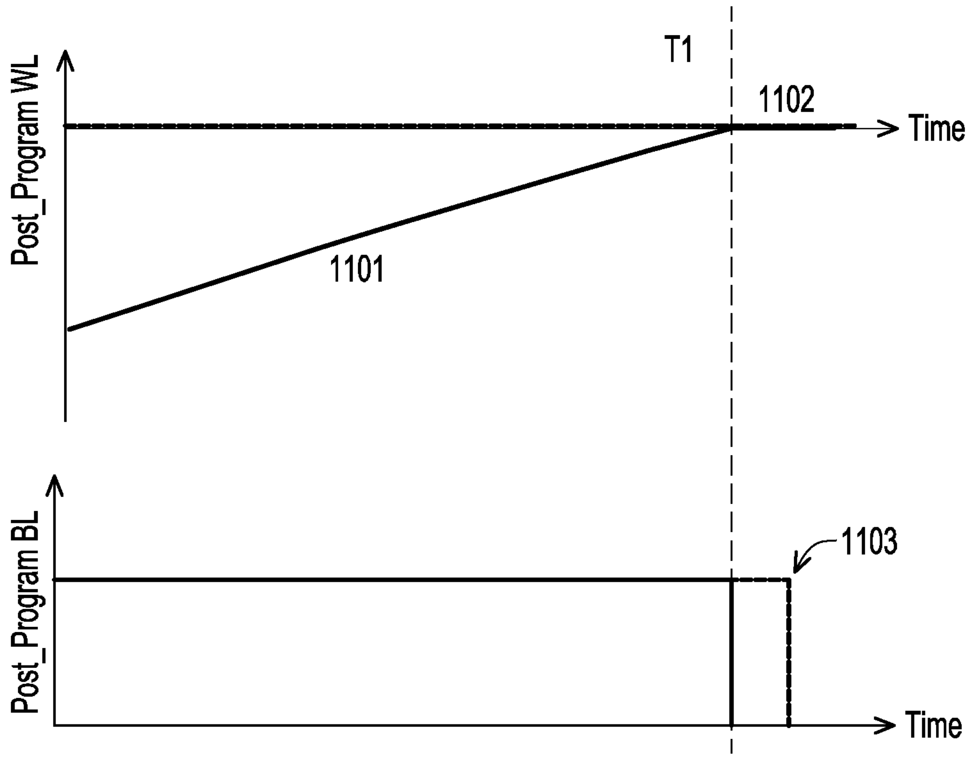
FIG. 11 illustrates an example of performing a post program operation according to an exemplary embodiment of the disclosure.

An example of the voltage control of the post program operation is shown in FIG. 11. In the example of FIG. 11, during the post program operation of step S204 to recover overly erased memory cells, the word line voltage is increased 1101 from a first negative voltage to a second negative voltage when the leakage current measured by a current detector (e.g. 801) exceeds a predetermined current threshold. The first negative voltage could be, for example, −3 volts. The second negative voltage is higher than the first negative voltage. The predetermined current threshold could be, for example, 80 microamp (uA). When the leakage current is detected to be less than the predetermined current threshold 1102 as the result of the post program operation, the word line voltage is kept at the second negative voltage. As for the bit line voltage, it is kept at the constant bias voltage (e.g. 4V) until the leakage current is detected to be less than the predetermined current threshold 1103. However, it is worth noting that the duration for keeping the bit line at the constant voltage is different among the bit lines since the speed at which the leaky current of the bit line falling below the predetermined current threshold is different for each bit line.

In view of the aforementioned descriptions, the disclosure is suitable for being used in a flash memory device and is able to automatically perform an erase operation to recover overly erased memory cells even if the erase operation is interrupted due to a suspension the erase operation or a power outage of the flash memory device.

No element, act, or instruction used in the detailed description of disclosed embodiments of the present application should be construed as absolutely critical or essential to the present disclosure unless explicitly described as such.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method of erasing memory cells of a flash memory device which includes a memory controller, and the method comprising:

performing first erase operation to erase a block of memory cells of the flash memory device by applying an erase bias voltage on the block of memory cells;

increasing the erase bias voltage in a stepping manner until a lower edge of a distribution of threshold voltages of the block of memory cells is lower than an erase low side verify voltage;

performing a first post program operation for recovering overly erased memory cells of the block of memory cells until the lower edge of the distribution of threshold voltages of the block of memory cells is higher than a post verify voltage, wherein the memory controller is configured to perform the first post program operation in a column-by-column manner by:

setting a bit line of the block of memory cells at a predetermined voltage, and adjusting a negative word line voltage which is connected to the bit line in an increasing manner until a leakage current of the bit line is less than a predetermined threshold;

performing a second erase operation to erase the block of memory cells to determine whether an upper edge of the distribution of threshold voltages of the block of memory cells is lower than an erase high side verify voltage; and having determined that the block of memory cells to have been completely erased after the distribution of threshold voltages of the block of memory cells is completely within the post verify voltage and the erase high side verify voltage, wherein the erase low side verify voltage and the post verify voltage are predetermined threshold voltages, and the post verify voltage is higher than the erase low side verify voltage, and a voltage difference between the post verify voltage and the erase low side verify voltage is less than a step increase of the erase bias voltage during increasing the erase bias voltage in the stepping manner.

2. The method of claim 1, wherein the bit line voltage is kept at the erase bias voltage which is kept constant until the leakage current is detected to be less than the predetermined current threshold.

3. The method of claim 1, wherein in response to the lower edge of the distribution of threshold voltages of the block of memory cells being lower than the erase low side verify voltage, the erase bias voltage is kept constant.

4. The method of claim 1, wherein the erase high side verify voltage is a predetermined threshold voltage which provides an erase margin from a reference voltage which is between the distribution of threshold voltages of the block of memory cells which are to be erased and a distribution of threshold voltages of another block of memory cells which are programmed.

5. The method of claim 1, wherein the erase low side verify voltage provides a margin from a level of threshold voltage at which a leakage current occurs.

6. The method of claim 1, wherein increasing the erase bias voltage in the stepping manner until the lower edge of the distribution of threshold voltages of the block of memory cells is lower than the erase low side verify voltage comprising:

determining whether the lower edge of the distribution of threshold voltages of the block of memory cells is lower than the erase low side verify voltage;

performing the first post program operation in response to the lower edge of the distribution of threshold voltages of the block of memory cells being lower than the erase low side verify voltage; and increasing the erase bias voltage automatically by one voltage step in response to the lower edge of the distribution of threshold voltages of the block of memory cells being higher than the erase low side verify voltage.

7. The method of claim 6, wherein determining whether the lower edge of the distribution of threshold voltages of the block of memory cells is lower than the erase low side verify voltage comprising:

determine a bit line conducts current while setting the bit line at the erase low side verify voltage and setting each word line at a constant voltage.

8. The method of claim 1, wherein performing the second erase operation to erase the block of memory cells to determine whether the upper edge of the distribution of threshold voltages of the block of memory cells is lower than the erase high side verify voltage comprising:

performing a second post program operation for recovering overly erased memory cells of the block of memory cells;

determining whether the upper edge of the distribution of threshold voltages of the block of memory cells is lower than the erase high side verify voltage; and performing a third erase operation to erase the block of memory cells in response to the upper edge of the distribution of threshold voltages of the block of memory cells being higher than the erase high side verify voltage.

9. The method of claim 1, wherein adjusting the negative word line voltage which is connected to the bit line in the increasing manner until the leakage current of the bit line is less than the predetermined threshold comprising:

adjusting the negative word line voltage which is connected to the bit line in the increasing manner from a first negative voltage toward a second negative voltage until the leakage current of the bit line is less than the predetermined threshold as the second negative voltage is higher than the first negative voltage.

10. The method of claim 9, wherein as the leakage current is detected to be less than the predetermined current threshold as the result of the first post program operation, the word line voltage is kept at the second negative voltage.

11. A flash memory device comprising:

a block of memory cells, a memory controller electrically connected to the block of memory cells and configured to:

perform first erase operation to erase a block of memory cells of the flash memory device by applying an erase bias voltage on the block of memory cells, increase the erase bias voltage in a stepping manner until a lower edge of a distribution of threshold voltages of the block of memory cells is lower than an erase low side verify voltage, perform a first post program operation for recovering overly erased memory cells until the lower ledge of the distribution of threshold voltages of the block of memory cells is higher than a post verify voltage, wherein the memory controller is configured to perform the first post program operation in a column-by-column manner by:

setting a bit line of the block of memory cells at a predetermined voltage, and adjusting a negative word line voltage which is connected to the bit line in an increasing manner until a leakage current of the bit line is less than a predetermined threshold, perform a second erase operation to erase the block of memory cells until an upper edge of the distribution of threshold voltages of the block of memory cells is lower than an erase high side verify voltage, and determine that the block of memory cells to have been completely erased after the distribution of threshold voltages of the block of memory cells is completely within the post verify voltage and the erase high side verify voltage, wherein the erase low side verify voltage and the post verify voltage are predetermined threshold voltages, and the post verify voltage is higher than the erase low side verify voltage, and a voltage difference between the post verify voltage and the erase low side verify voltage is less than a step increase of the erase bias voltage during increasing the erase bias voltage in the stepping manner.

12. The flash memory device of claim 11, wherein as the leakage current is detected to be less than the predetermined current threshold as the result of the first post program operation, the word line voltage is kept at the second negative voltage.

13. The flash memory device of claim 11, wherein in response to the lower edge of the distribution of threshold voltages of the block of memory cells being lower than the erase low side verify voltage, memory controller keeps the erase bias voltage constant.

14. The flash memory device of claim 11, wherein the erase high side verify voltage is a predetermined threshold voltage which provides an erase margin from a reference voltage which is between the distribution of threshold voltages of the block of memory cells which are to be erased and a distribution of threshold voltages of another block of memory cells which are programmed.

15. The flash memory device of claim 11, wherein the erase low side verify voltage provides a margin from a level of threshold voltage at which a leakage current occurs.

16. The flash memory device of claim 11, wherein memory controller is configured to increase the erase bias voltage in the stepping manner until the lower edge of the distribution of threshold voltages of the block of memory cells is lower than the erase low side verify voltage comprising:

determine whether the lower edge of the distribution of threshold voltages of the block of memory cells is lower than the erase low side verify voltage, perform the first post program operation in response to the lower edge of the distribution of threshold voltages of the block of memory cells being lower than the erase low side verify voltage, and increase the erase bias voltage automatically by one voltage step in response to the lower edge of the distribution of threshold voltages of the block of memory cells being higher than the erase low side verify voltage.

17. The flash memory device of claim 16, wherein the memory controller is configured to determine whether the lower edge of the distribution of threshold voltages of the block of memory cells is lower than the erase low side verify voltage comprising:

determine a bit line conducts current while setting the bit line at the erase low side verify voltage and setting each word line at a constant voltage.

18. The flash memory device of claim 11, wherein the memory controller is configured to perform the second erase operation to erase the block of memory cells to determine whether the upper edge of the distribution of threshold voltages of the block of memory cells is lower than the erase high side verify voltage comprising:

perform a second post program operation for recovering overly erased memory cells of the block of memory cells, determine whether the upper edge of the distribution of threshold voltages of the block of memory cells is lower than the erase high side verify voltage, and performing a third erase operation to erase the block of memory cells in response to the upper edge of the distribution of threshold voltages of the block of memory cells being higher than the erase high side verify voltage.

19. The flash memory device of claim 11, wherein adjust the negative word line voltage which is connected to the bit line in the increasing manner until the leakage current of the bit line is less than the predetermined threshold comprising:

adjust the negative word line voltage which is connected to the bit line in the increasing manner from a first negative voltage toward a second negative voltage until the leakage current of the bit line is less than the predetermined threshold as the second negative voltage is higher than the first negative voltage.

20. The flash memory device of claim 19, wherein as the leakage current is detected to be less than the predetermined current threshold as the result of the first post program operation, the word line voltage is kept at the second negative voltage.

* * * * *